United States Patent
Green

(10) Patent No.: US 6,559,685 B2
(45) Date of Patent: May 6, 2003

(54) REGENERATIVE SIGNAL LEVEL CONVERTER

(75) Inventor: Michael M. Green, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/836,742

(22) Filed: Apr. 16, 2001

(65) Prior Publication Data

US 2001/0033186 A1 Oct. 25, 2001

Related U.S. Application Data

(60) Provisional application No. 60/198,932, filed on Apr. 21, 2000.

(51) Int. Cl.[7] ............................ G01R 19/00; G11C 7/00
(52) U.S. Cl. .......................................... 327/57; 327/100
(58) Field of Search ........................ 327/51, 52, 55–57, 327/63–65, 69, 70, 72, 76–82, 85, 89, 90; 365/205, 207

(56) References Cited

U.S. PATENT DOCUMENTS

| 5,471,174 A | * 11/1995 | Petty et al. .................. 330/257 |
| 5,703,803 A | * 12/1997 | Shadan et al. ................. 327/51 |
| 5,939,903 A | * 8/1999 | Lin .............................. 327/55 |
| 6,147,514 A | * 11/2000 | Shiratake ..................... 327/55 |

* cited by examiner

Primary Examiner—My-Trang Nu Ton
(74) Attorney, Agent, or Firm—Townsend and Townsend Crew LLP

(57) ABSTRACT

Method and circuitry for converting a differential logic signal to a single-ended logic signal that minimize delay. In specific embodiments differential logic signals of the type employed in, for example, current-controlled complementary metal-oxide-semiconductor ($C^3MOS$) logic are converted to single-ended rail-to-rail CMOS logic levels using the regenerative action of a

16 Claims, 3 Drawing Sheets

REGENERATIVE SIGNAL LEVEL CONVERTER

CROSS-REFERENCES TO RELATED APPLICATIONS

This application claims priority from provisional application No. 60/198,932, filed Apr. 21, 2000, the disclosure of which is incorporated herein by reference.

BACKGROUND OF THE INVENTION

The present invention relates in general to integrated circuits, and in particular to improved method and circuitry for converting a differential logic signal of the type employed in, for example, current-controlled complementary metal-oxide-semiconductor ($C^3MOS$) logic, to single-ended logic signal employed in standard CMOS logic.

Converting signals from $C^3MOS$ format, which is differential in nature to standard CMOS format which is single-ended with rail-to-rail voltage levels, is a difficult operation. Most conversion circuits require careful optimization to "shape" the single-ended rail-to-rail signal. FIG. 1 depicts a conventional converter circuit with a conventional differential stage 100 that receives a differential signal Vin+/Vin−. Two CMOS inverters 102 and 104 each with carefully optimized channel width to length W/L ratios for their transistors, shape the output signal of differential stage 100. The rail-to-rail CMOS signal is obtained at output OUT.

There are a number of disadvantages associated with this common signal level conversion technique. The two additional inverters (102 and 104) introduce long delays that may become unacceptable for ultra high speed applications such as those using $C^3MOS$ logic. Further, the delay tends to be highly variant with process corners and temperature. Moreover, the delay for the high-to-low transition is typically not equal to the delay for the low-to-high transition in the optimized inverters. This causes timing problems and, for clock signals, duty cycles deviating from 50%.

There is therefore a need for differential to single-ended signal level converters that operate effectively at very high speeds.

SUMMARY OF THE INVENTION

The present invention provides method and circuitry for converting a differential signal to a single-ended signal for high speed circuit applications. Broadly, the invention takes advantage of the regenerative action of a CMOS latch to convert a differential logic signal to a single-ended one with minimum delay. According to a specific embodiment of the invention, the state of a CMOS latch is switched by current pulses generated by a differential pair with $C^3MOS$ input levels. The latch is made of CMOS inverters with transistors having standard channel sizes. When a pulse is applied to either side of the latch, a fast and nearly symmetric transition will occur due to the regenerative nature of the latch, yielding a single-ended rail-to-rail CMOS level output signal with minimum delay and near 50% duty cycle.

Accordingly, in one embodiment, the present invention provides a circuit for converting a differential logic signal to a single-ended logic signal, including: a differential input stage coupled to receive the differential logic signal and configured to steer current into a first output branch or a second output branch in response to the differential logic signal; a first output transistor coupled to the first output branch; a second output transistor coupled to the second output branch; and a CMOS latch coupled between the first output transistor and the second output transistor.

In a more specific embodiment of the present invention the CMOS latch includes a first CMOS inverter having an input and an output; and a second CMOS inverter having an input coupled to the output of the first CMOS inverter, and an output coupled to the input of the CMOS inverter, wherein channel sizes of transistors inside each CMOS inverter are designed to achieve optimum switching in both directions.

In another embodiment, the present invention provides a CMOS circuit comprising: a first circuit implemented in $C^3MOS$ logic wherein logic levels are signaled by current steering in one of two or more branches in response to a differential input signal; a differential signal to single-ended signal converter coupled to the first circuit, the converter having a CMOS latch that is configured to switch states in response to a self-regulating current pulse that is generated in response to the differential input signal, thereby converting the differential signal from the first circuit to a single-ended CMOS logic signal; and a second circuit coupled to the converter to receive the single-ended CMOS logic signal and implemented in standard CMOS logic wherein substantially zero static current is dissipated.

In yet another embodiment the present invention provides a method of converting a differential logic signal to a single-ended logic signal including receiving a differential logic signal at inputs of a differential input circuit; generating a current pulse at one of two outputs of the differential pair in response to the differential logic signal; and switching the state of a regenerative CMOS latch in response to the current pulse.

The detailed description and the accompanying drawings provide a better understanding of the nature and advantages of the signal level converter of the present invention.

DETAILED DESCRIPTION OF SPECIFIC EMBODIMENTS

Figure 1:
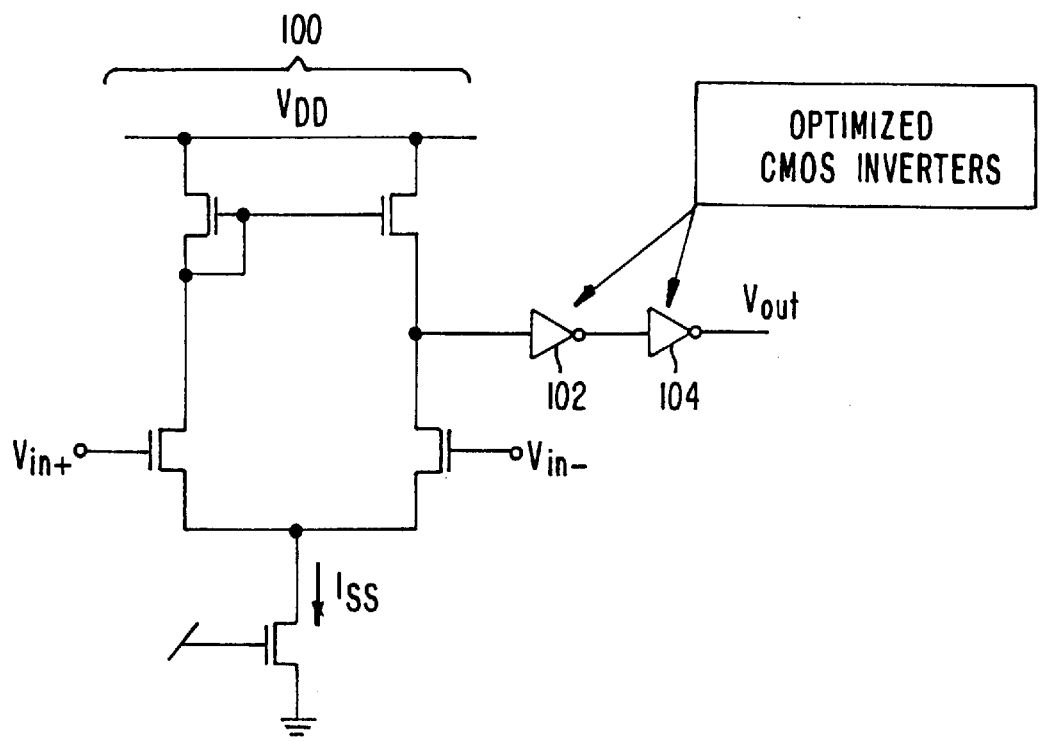
FIG. 1 shows a conventional CMOS differential to single-ended converter circuit.
Figure 2A:
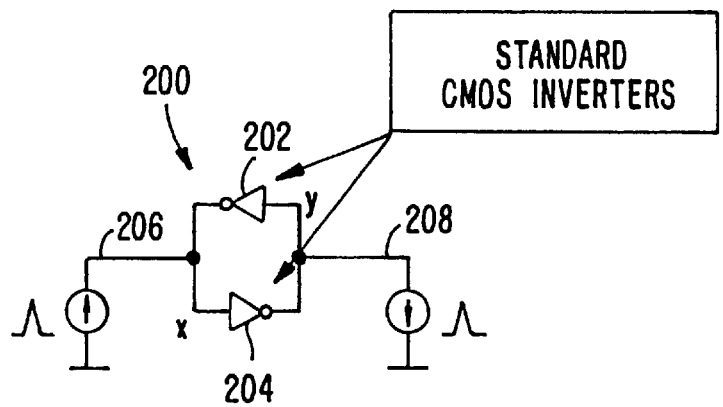
FIGS. 2A and 2B provide a simplified depiction of a regenerative CMOS latch of the type used in the signal level converter according to one embodiment of the present invention.
Figure 2B:
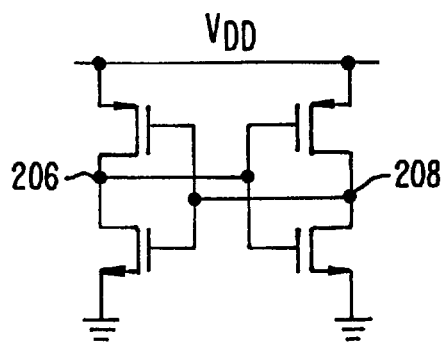

Signal levels used in CMOS logic are rail-to-rail, meaning that the signal is typically single-ended with its high logic level typically determined by the positive power supply (e.g., 1.8V) and its low logic level determined by ground (or the negative power supply). Certain types of logic circuitry, such as high speed current-controlled CMOS logic (or $C^3MOS$ logic), use differential logic signals. Differential $C^3MOS$ logic processes differential signals that typically have amplitudes less than one volt, e.g., 500 mV peak-to-peak single-ended. The present invention provides fast and efficient method and circuitry for converting such a differential logic signal to a rail-to-rail single-ended one. Referring to FIG. 2A, there is provided a simplified depiction of a regenerative CMOS latch 200 of the type used in the signal level converter according to an embodiment of the present invention. CMOS latch 200 includes a first CMOS inverter 202 having its input terminal and output terminal respectively connected to the output terminal and input terminal of a second CMOS inverter 204. Inverters 202 and 204 together are made up of CMOS transistors as shown in FIG. 2B. Standard channel width to length (W/L) ratios are employed in designing the transistors in the inverters to provide for optimized transitions in both directions (low-to-high and high-to-low).

In operation, assuming node 206 is initially low and node 208 is initially high, applying a positive current pulse to node 206 and a negative current pulse to node 208, causes latch 200 to change its state symmetrically. That is, transitions at nodes 206 and 208 occur simultaneously. When a pulse is applied to only one side of latch 200, a nearly symmetric transition occurs due to the regenerative nature of the latch. For example, given the same initial state where node 206 is low and node 208 is high, if a single positive current pulse is applied to node 206, inverter 204 operates to pull node 208 low. As node 208 is pulled low, inverter 202 responds by pulling its output, node 206, high reinforcing the action of inverter 204. This regenerative action results in a near symmetric transition of the state of the latch.

Figure 3:
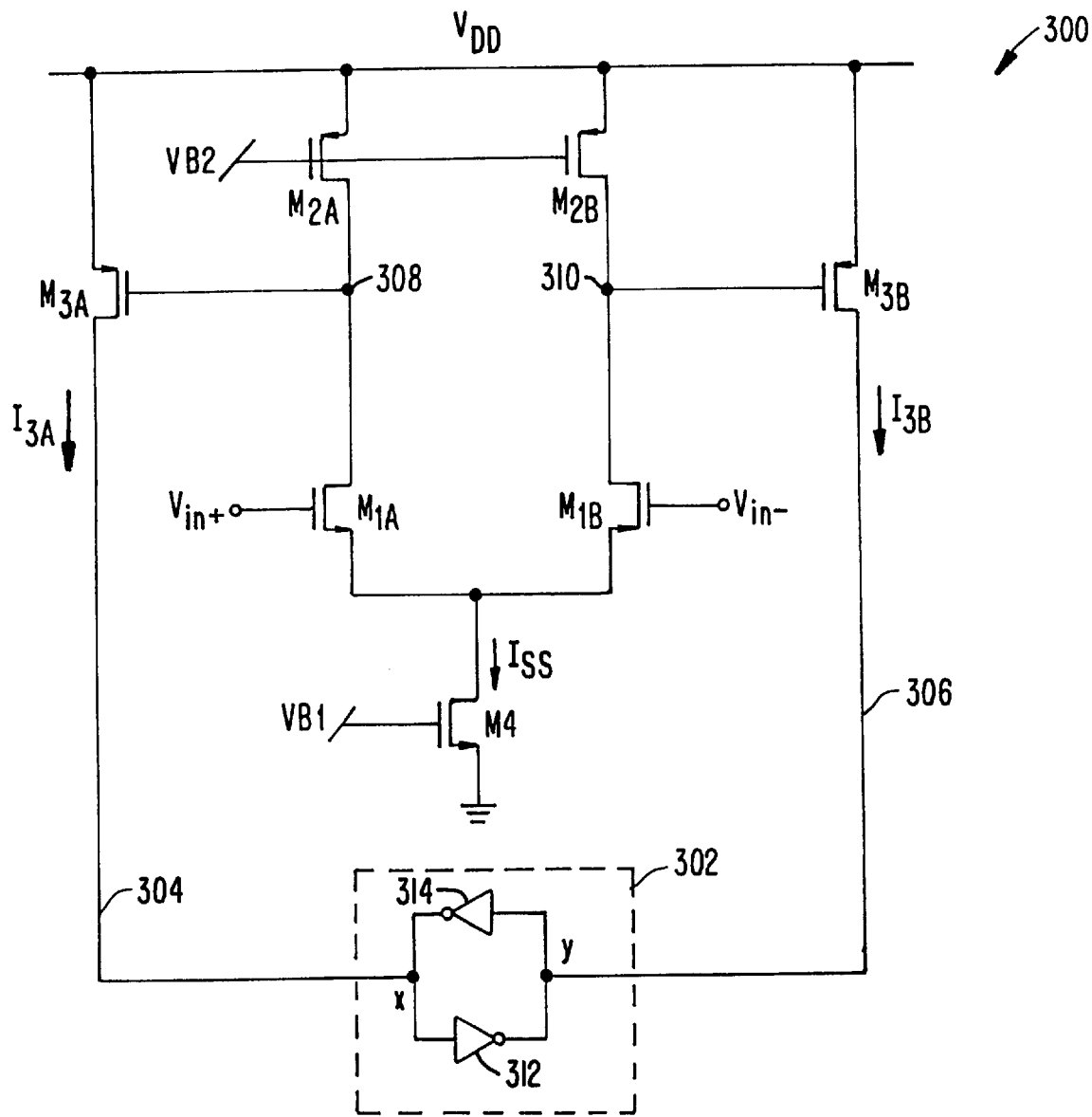
FIG. 3 is an exemplary circuit implementation for a differential to single-ended logic signal converter according to an embodiment of the present invention.

An exemplary embodiment of a differential to single-ended logic signal level converter 300 according to the present invention employs the CMOS latch of FIG. 2 as shown in FIG. 3. In this illustrative embodiment, converter 300 includes a differential input pair of n-channel transistors M1A and M1B that receive the differential logic signal Vin+ and Vin− at their gate terminals, respectively. An n-channel current source transistor M4 connects to the common-source node of the input transistors. Current source transistor M4 receives a bias voltage VB1 at its gate terminal and draws bias current Iss. P-channel load transistors M2A and M2B respectively connect to drain terminals of input transistors M1A and M1B, and have their gate terminals coupled to another bias voltage VB2. A first p-channel transistor M3A has its gate terminal connected to the drain terminal of input transistor M1A, and a second p-channel transistor M3B has its gate terminal connected to the drain terminal of input transistor M1B. Transistor M3A connects between the power supply VDD and one node, 304, of a CMOS latch 302, and transistor M3B connects between VDD and the other node, 306, of latch 302. It is to be understood that the circuit implementation shown in FIG. 3 is exemplary and for illustrative purposes only, and that different variations are possible. For example, load transistors M2A and M2B may instead be in the form of resistors. Polarity of the transistors may be reversed; e.g., input transistors being p-channel, etc.

The operation of the circuit of FIG. 3 is as follows. Assuming node 304 is initially low, a C³MOS-level differential signal is applied between the inputs Vin+ and Vin− such that, for example, transistor M1A is turned on and transistor M1B is turned off. This steers all of current Iss through transistors M2A and M1A causing node 308 to be pulled down to near ground and node 310 to be pulled up to near VDD. This in turn turns on transistor M3A and turns off transistor M3B. A large current I3A will then be conducted through common-source transistor M3A. This current causes node 304 to quickly increase to VDD. Inverter 312 in latch 302 thus drives node 306 to ground with inverter 314 regeneratively helping the pull-up on node 304 to VDD. A full single-ended CMOS level signal is thus made available at both nodes 304 and 306. Node 304 provides the non-inverting output of converter 300 while node 306 provides an inverting output for converter 300. With node 304 at VDD, the drain to source voltage (VDS) of transistor M3A becomes nearly zero, thereby bringing current I3A through transistor M3A back to zero. The current pulse is thus self-regulating. That is, the pulse lasts exactly as long as needed to change the state of the latch. The converter of the invention, therefore, minimizes the delay, and does not suffer from the other drawbacks associated with the conventional converters. It is understood that latch 302 switches in the opposite direction in a similar fashion when an input C³MOS signal of opposite polarity is applied to the inputs.

Figure 4:
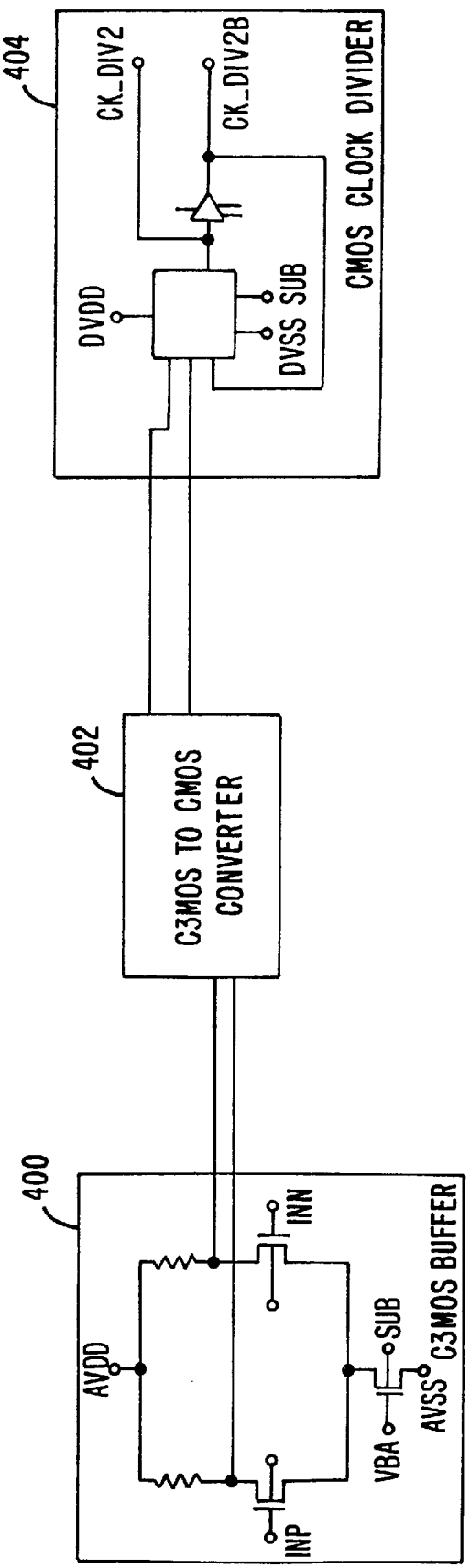
FIG. 4 shows an exemplary circuit application for the differential logic signal to single-ended logic signal converter according to an illustrative embodiment of the invention.

According to another embodiment of the present invention, ultrahigh speed CMOS circuitry is implemented using the differential to single-ended converter of the type shown in FIG. 3. Ultra high speed circuit applications such as synchronous optical network (SONET) process signals in the several GigaHertz range. To implement such high speed circuitry using standard silicon CMOS technology, the high speed signals are first processed using the faster C³MOS logic and are then divided down in frequency and converted to CMOS logic for further processing by standard CMOS logic circuitry. This aspect of the invention is further described in greater detail in commonly-assigned co-pending patent application Ser. No. 09/484,896, titled "Current-Controlled CMOS Logic Family," by Hairapetian, filed Jan. 18, 2000, which is hereby incorporated by reference in its entirety. Referring to FIG. 4, there is shown an exemplary circuit application for the signal level converter according to an embodiment of the present invention. In this illustrative example, a high speed buffer 400 implemented in C³MOS logic processes differential C³MOS logic signals that are to be converted to standard rail-to-rail CMOS logic signal for further processing by conventional CMOS logic. The differential output of buffer 400 is applied to the differential input of converter 402. Converter 402 is of the type shown in FIG. 3 and converts the differential signal to a single-ended CMOS logic signal that is then applied, in this example, to a divide-by-two circuit 404. Divide-by-two circuit 404 is implemented using standard CMOS logic and operates to divide down the frequency of the signal for further processing by downstream CMOS logic circuitry. It is to be understood that in other embodiments C³MOS buffer 400 may be any other type of C³MOS logic (e.g., flip-flops, AND, OR, EXOR gates, and the like), and divide-by-two circuit 404 may similarly be any other type of logic circuitry using standard CMOS logic signals.

The present invention thus provides method and circuitry for converting a differential signal to a single-ended signal for high speed circuit applications. The invention takes advantage of the regenerative action of a CMOS latch to convert a differential logic signal to a single-ended one with minimum delay. According to a specific embodiment of the invention, the state of a CMOS latch is switched by current pulses generated by a differential pair with C³MOS input levels. While the above provides a complete description of specific embodiments of the present invention, it is possible to use various alternatives, modifications and equivalents. Therefore, the scope of the present invention should not be limited to the specific and illustrative embodiment described above, and should instead be determined with reference to the appended claims along with their full scope of equivalents.

What is claimed is:

1. A complementary metal-oxide-semiconductor (CMOS) circuit for converting a differential logic signal to a single-ended logic signal, comprising:

a differential input stage coupled to receive the differential logic signal and configured to steer current into a first output branch or a second output branch in response to the differential logic signal;

a first output transistor having a gate terminal coupled to the first output branch;

a second output transistor having a gate terminal coupled to the second output branch; and a CMOS latch coupled between the first output transistor and the second output transistor.

2. The CMOS circuit of claim 1 wherein the CMOS latch comprises:

a first node coupled to the first output transistor;

a second node coupled to the second output transistor;

a first inverter having an input coupled to the first node and an output coupled to the second node; and a second inverter having an input coupled to the second node and an output coupled to the first node.

3. The CMOS circuit of claim 2 wherein when the differential logic signal signals a first logic state, the differential input stage activates the first output transistor, and when the differential logic signal signals a second logic state, the differential input stage activates the second output transistor.

4. The CMOS circuit of claim 3 wherein the first output transistor is configured such that when it is activated it applies a self-regulating current pulse to the first node.

5. The CMOS circuit of claim 4 wherein the second output transistor is configured such that when it is activated it applies a self-regulating current pulse to the second node.

6. The CMOS circuit of claim 1 wherein the differential input stage comprises:

first and second differential input transistors coupled to receive the differential logic signal;

first and second load devices respectively coupling the first and second differential input transistors to a power supply node; and a current source coupled to a common-source terminal of the first and second differential input transistors.

7. The CMOS circuit of claim 6 wherein the first output transistor comprises the gate terminal coupled to the first differential input transistor, a first current-carrying terminal coupled to the power supply node and a second current carrying terminal coupled to a first node of the CMOS latch.

8. The CMOS circuit of claim 7 wherein the second output transistor comprises the gate terminal coupled to the second differential input transistor, a first current-carrying terminal coupled to the power supply node and a second current carrying terminal coupled to a second node of the CMOS latch.

9. The CMOS circuit of claim 8 wherein the first and second differential input transistors comprise n-channel transistors, the first and second load devices comprise p-channel transistors, the current-source comprises an n-channel transistor, and the first and second output transistors comprise p-channel transistors.

10. The CMOS circuit of claim 6 wherein the first and second load devices comprise transistors.

11. The CMOS circuit of claim 6 wherein the first and second load devices comprise resistors.

12. A complementary metal-oxide-semiconductor (CMOS) circuit comprising:

a first circuit implemented in current-controlled CMOS ($C^3MOS$) logic wherein logic levels are signaled by current steering in one of two or more branches in response to a differential input signal;

a differential signal to single-ended signal converter coupled to the first circuit, the converter having a CMOS latch that is configured to switch states in response to a self-regulating current pulse that is generated in response to the differential input signal, thereby converting the differential signal from the first circuit to a single-ended CMOS logic signal; and a second circuit coupled to the converter to receive the single-ended CMOS logic signal and implemented in standard CMOS logic wherein substantially zero static current is dissipated.

13. The CMOS circuit of claim 12 wherein the differential signal to single-ended signal converter further comprises:

a differential pair input structure having a first branch with a first input transistor coupled to a first load device, and a second branch with a second input transistor coupled to a second load device, and a current source coupled to the first and second input transistors;

a first output transistor coupled to the first branch and to a first node of the CMOS latch; and a second output transistor coupled to the second branch and to a second node of the CMOS latch.

14. A method for converting a differential logic signal to a single-ended logic signal, comprising:

processing a differential logic signal using current-controlled complementary metal-oxide semiconductor ($C^3MOS$) logic wherein logic levels are signaled by current steering in one of two or more branches in response to a differential input signal;

converting the processed differential logic signal to a single-ended logic signal using a converter having a regenerative complementary metal-oxide semiconductor (CMOS) latch that is controlled by a self-regulating current pulse responsive to the processed differential logic signal; and processing the single-ended logic signal using standard CMOS logic.

15. The method of claim 14, wherein converting the differential logic signal to a single-ended logic signal comprises:

receiving the processed differential logic signal at inputs of a differential input circuit;

generating a self-regulating current pulse at one of two outputs of the differential input circuit in response to the processed differential logic signal; and switching the state of the regenerative CMOS latch in response to the self-regulating current pulse.

16. The method of claim 14, wherein the regenerative CMOS latch switches from rail to rail generating a rail-to-rail single-ended logic signal.

* * * * *